United States Patent
Leong et al.

(10) Patent No.: US 8,717,103 B2
(45) Date of Patent: May 6, 2014

(54) TECHNIQUES TO IMPROVE THE STRESS ISSUE IN CASCODE POWER AMPLIFIER DESIGN

(75) Inventors: Poh Boon Leong, Singapore (SG); Ping Song, Singapore (SG); Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 3 days.

(21) Appl. No.: 13/336,857

(22) Filed: Dec. 23, 2011

(65) Prior Publication Data
US 2012/0161879 A1    Jun. 28, 2012

Related U.S. Application Data

(60) Provisional application No. 61/426,977, filed on Dec. 23, 2010.

(51) Int. Cl.
*H03F 3/04* (2006.01)
(52) U.S. Cl.
USPC .......................................... 330/302; 330/253
(58) Field of Classification Search
USPC .......................................... 330/252–261, 302
See application file for complete search history.

(56) References Cited

U.S. PATENT DOCUMENTS

| | | | | |
|---|---|---|---|---|
| 7,123,073 B2 * | 10/2006 | Nakatani et al. | ............... | 327/358 |
| 8,378,750 B2 * | 2/2013 | Sutardja et al. | ............... | 330/264 |
| 2008/0191313 A1 | 8/2008 | Rofougaran et al. | | |
| 2009/0256631 A1 | 10/2009 | Bockelman et al. | | |
| 2010/0301944 A1 | 12/2010 | Yamamoto et al. | | |

OTHER PUBLICATIONS

International Search Report and Written Opinion from International Application No. PCT/US2011/067244 filed Dec. 23, 2011.

* cited by examiner

*Primary Examiner* — Hieu Nguyen

(57) ABSTRACT

An amplifier includes a first transistor, and a first inductor disposed between the first transistor and a voltage source. A first output node is between the first transistor and the first inductor. The amplifier further includes a second inductor disposed between the first transistor and ground. The amplifier further includes a second transistor, and a third inductor disposed between the second transistor and a ground. A second output node is between the second transistor and the third inductor. The amplifier further includes a fourth inductor disposed between the second transistor and the voltage source. The amplifier further includes a first capacitor disposed between the first output node and the second output node, and a second capacitor disposed between a first mid-node, which is between the first transistor and the first inductor, and a second mid-node, which is between the second transistor and fourth inductor.

21 Claims, 6 Drawing Sheets

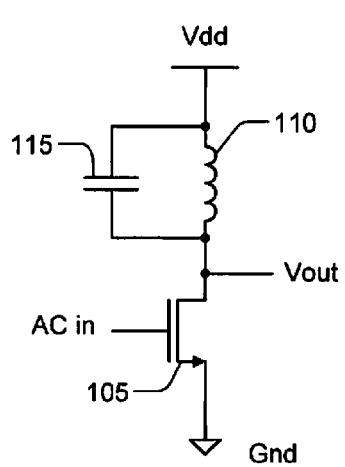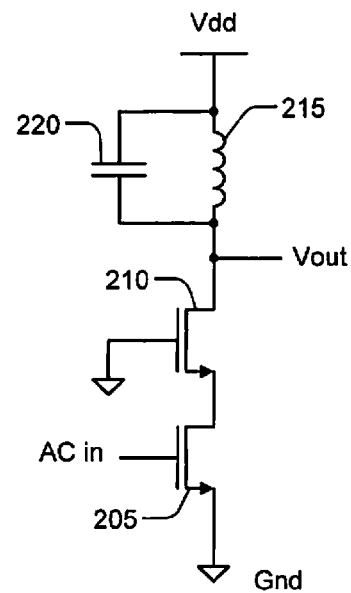
FIG. 1
Prior Art
FIG. 2
Prior Art

TECHNIQUES TO IMPROVE THE STRESS ISSUE IN CASCODE POWER AMPLIFIER DESIGN

CROSS REFERENCE TO RELATED APPLICATIONS

This application claims the benefit of, and priority to, U.S. Provisional Patent App. No. 61/426,977, filed Dec. 23, 2010, titled "TECHNIQUES TO IMPROVE THE STRESS ISSUE IN CASCODE POWER AMPLIFIER DESIGN," of Leong et al., which is incorporated herein by reference in its entirety for all purposes.

BACKGROUND

Embodiments described herein generally relate to power amplifiers, and more particularly relate to power amplifiers having improved power amplification by reduction of stress via even harmonic cancellation.

Unless otherwise indicated herein, the approaches described in the background section are not prior art to the claims in this application and are not admitted to be prior art by inclusion in the background section.

Power amplifiers are generally configured to receive an AC signal, such as an RF signal, and boost the power of the AC signal. Traditional power amplifiers often include a single nMOS transistor or a cascode with tank loading. FIG. 1 is a simplified schematic of a traditional power amplifier 100 that includes an nMOS transistor 105 coupled between an inductor 110 and ground. Inductor 110 may be coupled to a voltage source Vdd. Inductor 110 may also be coupled to a capacitor 115 in a tank configuration for tuning the resonance of power amplifier 100. NMOS transistor 105 may be in a common source configuration with the gate of nMOS transistor 105 configured to operate as an input AC In to receive an AC signal and a drain coupled to the output Vout of power amplifier 100. FIG. 2 is a simplified schematic of another traditional power amplifier 200 that includes first and second nMOS transistors 205 and 210 in series between an inductor 215 and ground. Inductor 215 may be coupled to a voltage source Vdd. Inductor 215 may also be coupled to a capacitor 220 in a tank configuration for tuning the resonance of power amplifier 200. The nMOS transistors 205 and 210 may be in a common source, common gate configuration (i.e., a cascode configuration) with the gate of nMOS transistor 205 configured to operate as an input AC In to receive an AC signal and a drain of transistor 210 coupled to the output Vout of power amplifier 200.

In traditional power amplifiers, such as power amplifiers 100 and 200 described above, the typical maximum voltage at the output Vout is 2Vdd and the typical maximum power output is about $(2Vdd)^2/R$ where R is a load resistance of the power amplifiers. The typical maximum voltage output is limited by a number of factors including the stress across the transistors, such as the stress across nMOS transistor 205 and the stress across nMOS transistor 210. For example, if power amplifier 200 is configured for 2.5V operation, voltages of 2.7V and above across nMOS transistor 205 and nMOS transistor 210 with current running through nMOS transistors 205 and 210 causes stress, which negatively effects maximum amplification. Voltages of 2.7V and above across nMOS transistor 205 and nMOS transistor 210 may occur due to fundamental and higher order harmonics of the fundamental harmonic of a received AC signal.

While the power output of traditional power amplifiers, such as power amplifiers 100 and 200, is acceptable for a number of amplification, it would be desirable to provide new power amplifiers that provide higher power output than the power output of traditional power amplifiers via the reduction of stress.

SUMMARY

Embodiments described herein generally relate to power amplifiers, and more particularly relate to power amplifiers having improved power amplification.

According to one embodiment, a power amplifier includes a first transistor, and a first inductor disposed between the first transistor and a voltage source. A first node between the first transistor and the first inductor is a first output node. The power amplifier further includes a second inductor disposed between the first transistor and ground. The power amplifier further includes a second transistor, and a third inductor disposed between the second transistor and a ground. A second node between the second transistor and the third inductor is a second output node. The power amplifier further includes a fourth inductor disposed between the second transistor and the voltage source. The power amplifier further includes a first capacitor disposed between the first output node and the second output node and configured as a pathway for cancellation of even harmonic signals on opposite ends of the first capacitor. The even harmonic signals are harmonics of a fundamental frequency of a received AC signal. The power amplifier further includes a second capacitor disposed between a first mid-node, which is between the first transistor and the first inductor, and a second mid-node, which is between the second transistor and fourth inductor, and configured as a pathway for cancellation of the even harmonic signals on opposite ends of the second capacitor.

According to a specific embodiment, the power amplifier further includes a third capacitor disposed between a body of the first transistor and a body of the second transistor and configured as a pathway for cancellation of even harmonic signals on opposite ends of the third capacitor.

According to another specific embodiment, the power amplifier further includes a third transistor disposed between the first transistor and the first inductor, and a fourth transistor disposed between the second transistor and the third inductor.

According to another specific embodiment, the first and the third transistors are in a first cascode configuration, and the second and the fourth transistors are in a second cascode configuration.

According to another specific embodiment, the power amplifier further includes a third capacitor disposed between a third mid-node, which is between the first and the third transistors, and a fourth mid-node, which is between the second and the fourth transistors, wherein the third capacitor is configured as a pathway for cancellation of the even harmonic signals on opposite ends of the third capacitor.

According to another specific embodiment, the first, the second, and the third capacitors are configured to equalize voltage differences across the first, the second, the third, and the fourth transistors.

According to another specific embodiment, the first and the third transistors are nMOS transistors, and the second and the fourth transistors are pMOS transistors.

According to another specific embodiment, the power amplifier further includes a third capacitor disposed between a body of the third transistor and a body of the fourth transistors, and configured as a pathway for cancellation of even harmonic signals on opposite ends of the third capacitor.

According to another specific embodiment, the power amplifier further includes a third capacitor in parallel with the first inductor, and a fourth capacitor in parallel with the fourth inductor.

According to another embodiment, a fully-differential power amplifier includes a first amplifier stage and a second amplifier stage. The first amplifier stage includes: a first transistor, a first inductor disposed between the first transistor and a voltage source, and a second inductor disposed between the first transistor and ground. A first node between the first transistor and the first inductor is a first output node. The first amplifier state further includes: a second transistor, a third inductor disposed between the second transistor and a ground, and a fourth inductor disposed between the second transistor and the voltage source. A second node between the second transistor and the third inductor is a second output node. The first amplifier stage further includes a first capacitor disposed between the first output node and the second output node and configured as a pathway for cancellation of even harmonic signals on opposite ends of the first capacitor where the even harmonic signals are harmonics of a fundamental frequency of a received AC signal. The first amplifier stage further includes a second capacitor disposed between a first mid-node, which is between the first transistor and the first inductor, and a second mid-node, which is between the second transistor and fourth inductor, and configured as a pathway for cancellation of the even harmonic signals on opposite ends of the second capacitor.

The second amplifier stage includes a third transistor, and a fifth inductor disposed between the third transistor and a voltage source, wherein a third node between the third transistor and the fifth inductor is a third output node. The second amplifier stage further includes a sixth inductor disposed between the third transistor and ground, and a fourth transistor. The second amplifier state further includes a seventh inductor disposed between the third transistor and a ground where a fourth node between the fourth transistor and the seventh inductor is a fourth output node. The second amplifier stage further includes an eighth inductor disposed between the fourth transistor and the voltage source. The second amplifier stage further includes a third capacitor disposed between the third output node and the fourth output node and configured as a pathway for cancellation of the even harmonic signals on opposite ends of the third capacitor. The second amplifier stage further includes a fourth capacitor disposed between a third mid-node, which is between the third transistor and the fifth inductor, and a fourth mid-node, which is between the fourth transistor and eighth inductor, and configured as a pathway for cancellation of the even harmonic signals on opposite ends of the fourth capacitor. The fully-differential power amplifier further includes a fifth capacitor disposed between gates of the first and the fourth transistors, and configured as a pathway for cancellation of the even harmonic signals on opposite ends of the fifth capacitor.

According to a specific embodiment, the fully-differential power amplifier, further includes a sixth capacitor disposed between gates of the second and the third transistors, and configured as a pathway for cancellation of the even harmonic signals on opposite ends of the sixth capacitor.

According to another specific embodiment, the fully-differential power amplifier, further includes a, a sixth capacitor disposed between a body of the first transistor and a body of the second transistor and configured as a pathway for cancellation of even harmonic signals on opposite ends of the sixth capacitor.

According to another specific embodiment, the fully-differential power amplifier, further includes a seventh capacitor disposed between a body of the third transistor and a body of the fourth transistor and configured as a pathway for cancellation of even harmonic signals on opposite ends of the seventh capacitor.

According to another specific embodiment, the first amplifier stage further includes a fifth transistor disposed between the first transistor and the first inductor; and a sixth transistor disposed between the second transistor and the fourth inductor.

According to a specific embodiment, the fully-differential power amplifier, further includes a sixth capacitor disposed between a body of the fifth transistor and a body of the sixth transistor and configured as a pathway for cancellation of even harmonic signals on opposite ends of the sixth capacitor.

According to another specific embodiment, the second amplifier stage further includes a seventh transistor disposed between the third transistor and the fifth inductor; and an eighth transistor disposed between the fourth transistor and the eighth inductor.

According to another specific embodiment, the fully-differential power amplifier, further includes a seventh capacitor disposed between a body of the seventh transistor and a body of the eighth transistor, and configured as a pathway for cancellation of even harmonic signals on opposite ends of the seventh capacitor.

According to another embodiment, a power-amplifier operation method for a power amplifier includes receiving an AC signal at an input, and canceling even harmonics of the AC signal across a first output node and a second output node via a capacitor. The method further includes transmitting the AC signal between the first output node and the second output node via the capacitor; and outputting at the first output node and the second output node an amplified AC signal, which is an amplification of the AC signal.

According to a specific embodiment, the power-amplifier operation method further includes canceling the even harmonics of the AC signal across a first mid-node and a second mid-node via a second capacitor. The first mid-node is between first and second transistors in a first cascode. The second mid-node is between third and fourth transistors in a second cascode. The first cascode and the second cascode are parallel between a voltage source and ground.

According to a specific embodiment, the power-amplifier operation method further includes canceling the even harmonics of the AC signal across a third mid-node and a fourth mid-node via a third capacitor. The third mid-node is between the first transistor and a first inductor, which is coupled to ground, and the fourth mid-node is between the third transistor and a second inductor, which is coupled to a voltage source.

According to a specific embodiment, the power-amplifier operation method further includes canceling the even harmonics of the AC signal across bodies of the first and the third transistors via a third capacitor, and canceling the even harmonics of the AC signal across bodies of the second and the fourth transistors via a fourth capacitor.

The following detailed description and accompanying drawings provide a more detailed understanding of the nature and advantages of the present invention.

BRIEF DESCRIPTION OF THE DRAWINGS

FIG. 1 is a simplified schematic of a traditional power amplifier that includes an nMOS transistor coupled between an inductor and ground;

FIG. 2 is a simplified schematic of another traditional power amplifier that may include first and second nMOS transistors and in series between an inductor and ground;

DETAILED DESCRIPTION

Embodiments described herein generally provide a power amplifier, and more particularly provide a power amplifier having improved power amplification.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Power amplifiers are generally configured to receive an AC signal, such as an RF signal, and boost the power of the received AC signal. Power amplifiers may be included in a variety of mobile devices, such as mobile telephones, computers (such as laptop computers, tablet computers, etc.), personal digital assistants, and the like. A power-amplified AC signal may be directed through an antenna of a mobile device for transmission. The maximum power output of traditional power amplifiers is limited due to a number of factors including the stress on transistors as well as other circuits in traditional power amplifiers. Stress is caused by a variety of factors including voltage differences across the transistors of a power amplifier where the voltages exceed a voltage-design level. For example, if a power amplifier is designed for 2.5V operation, voltages above 2.7V with current running through the power amplifier cause stress. Voltages that cause stress rise with decreasing current in a power amplifier. For example, voltage across transistors in a power amplifier designed for 2.5V may rise to 3.5V to 3.7V with little to no current running through the transistors. Voltages across the transistors of a power amplifier may rise above a specified design voltage due to higher order harmonics (e.g., $2^{nd}$ harmonic, $3^{rd}$ harmonic, $4^{th}$ harmonic, etc.) above the fundamental harmonic of a received AC signal. Power amplifier embodiments described herein provide for the reduction of stress in power amplifiers via the reduction of higher order harmonics at a number of power amplifier nodes of a power amplifier.

Figure 3A:
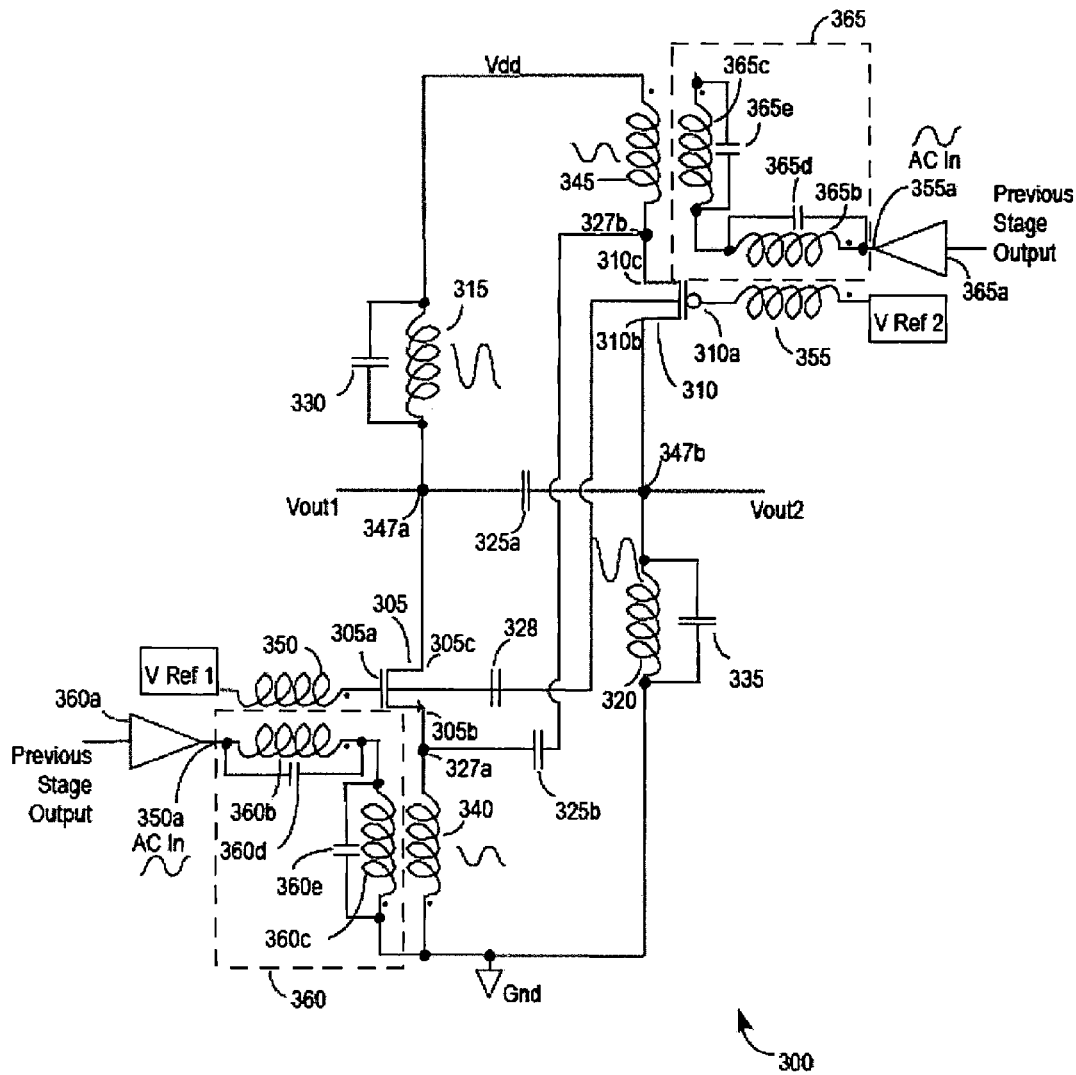
FIG. 3A is a simplified schematic of a power amplifier according to one embodiment.

FIG. 3A is a simplified schematic of a power amplifier 300 according to one embodiment. Power amplifier 300 includes a push-pull pair of transistors 305 and 310, (referred to as transistors 305 and 310). Power amplifier 300 further includes first and second inductors 315 and 320, a capacitor 325a, and a capacitor 325b. Power amplifier 300 may also include first and second tank capacitors 330 and 335. Capacitor 330 is coupled to inductor 315 in parallel (i.e., in a "tank" configuration). Tank capacitor 330 is configured to tune the resonant frequency of inductor 315. Tank capacitor 335 is coupled to inductor 320 in a tank configuration. Tank capacitor 335 is configured to tune the resonant frequency of inductor 320.

Transistors 305 and 310 may be metal-oxide-semiconductor field-effect transistors (MOSFETs), bipolar junction transistors (BJTs), or other transistors types. For convenience, power amplifier embodiments are described herein as including MOSFETs. While power amplifier embodiments are described herein as including MOSFETs, it will be understood by those of skill in the art that BJTs or other types of transistors may be appropriately substituted for the MOSFETs and these power amplifier embodiments that include BJTs or the like are considered to be within the scope and purview of the power amplifier embodiments.

According to one embodiment, transistor 305 is an nMOS transistor with a drain 305c (sometimes referred to as a drain region) coupled to a first end of inductor 315 where a second end of inductor 315 is coupled to a voltage source Vdd. A first output node (Vout1) 347a is disposed between drain 305c and the first end of inductor 315. A source 305b of transistor 305 may be coupled to a first end of the third inductor 340 where a second end of the third inductor 340 is coupled to ground. Specific configurations of the sources and the drains of transistors 305 and 310 are described herein for convenience of explanation of specific embodiments. Alternative embodiments of the power amplifiers may include alternative configurations of the sources and drains of transistors 305 and 310 as will be understood by those of skill in the art. As will be further understood by those of skill in the art, sources and drains are sometimes referred to herein as a source-drain node.

According to one embodiment, transistor 310 is a pMOS transistor with a drain 310b coupled a first end of inductor 320 where a second end of inductor 320 is coupled to ground. A second output node (Vout2) 347 is disposed between drain 310b and the first end of inductor 320. A source 310c of transistor 310 is coupled a first end of fourth inductor 345 where a second end of fourth inductor 345 is coupled to the voltage source Vdd. Inductors 315 and 320 may be considered the respective loads of the push-pull pair of transistors 305 and 310.

Capacitor 325a is disposed between the first output node 347a and the second output node 347b. That is, capacitor 325a is coupled between drains 305c and 310b of transistors 305 and 310. Capacitor 325b is coupled between a first mid-node 327a, which is between source 305b of transistor 305 and third inductor 340, a second mid-node 327b, which is between source 310c of transistor 310 and fourth inductor 345.

According to one embodiment, power amplifier 300 includes first and second input inductors 350 and 355. A first end of first input inductor 350 is coupled to a gate 305a of transistor 305 and a second end of first input inductor 350 may be coupled to a first reference voltage (labeled V Ref 1 in FIG. 3A), which may be a DC reference voltage. The reference voltage is sometimes referred to as a bias voltage. A first end of second input inductor 355 is coupled to a gate 310a of transistor 310 and a second end of second input inductor 355 may be coupled to a second reference voltage (labeled V Ref 2 in FIG. 3A), which may be a DC reference voltage. The first reference voltage V Ref 1 and the second reference voltage V Ref 2 may be the same voltage or a different voltage.

According to one specific embodiment, power amplifier 300 includes first and second phase conditioners 360 and 365. Phase conditioners 360 and 365 are described herein as having a specific configuration. Power amplifier 300 may include alternatively configured phase conditioners that condition the phase of the AC signals in power amplifier 300 as described below and as will be understood by those of skill in the art. The first and the second phase conditioners 360 and 365 are generally defined by surrounding dashed lines in FIG. 3. The first phase conditioner 360 is configured to condition the phase of the received AC signal received by the power amplifier at input 350a. Specifically, the first phase conditioner 360 is configured to condition the phase of the received AC signal at the gate 305a of transistor 305 and condition the phase of the AC signal at the third inductor 340. More specifically, first phase conditioner 360 is configured such that the phase of the AC signal at gate 305a of transistor 305 is 180 degrees out of phase with the AC signal at the ground side of third inductor 340. By providing that the AC signal received at the gate 305a of transistor 305 is 180 degrees out of phase with the AC signal of the third inductor 340, the first phase conditioner 360 is further configured such that the phase of the AC signal across first inductor 315 and third inductor 340 are in phase.

The second phase conditioner 365 is configured to condition the phase of the received AC received by power amplifier 300 at input 355a. Specifically, second phase conditioner 365 is configured to condition the phase of the received AC signal at gate 310a of transistor 310 and at the fourth inductor 345. More specifically, second phase conditioner 365 is configured such that the phase of the AC signal at gate 310a of transistor 310 is 180 degrees out of phase with the AC signal at the voltage source Vdd side of the fourth inductor 345. By providing that the AC signal received at the gate 310a of transistor 310 is 180 degrees out of phase with the AC signal of the fourth inductor 345, the second phase conditioner is further configured such that the phase of the AC signal across second inductor 320 and fourth inductor 345 are in phase.

The first and second phase conditioners 360 and 365 further provide that the phase of the AC signals across the first, second, third, and fourth inductors 315, 320, 340, and 345 are substantially in phase. Providing that the AC signals across first and the third inductors 315 and 340 are in phase ensures that the AC signal across first inductor 315 may have a higher maximum amplitude than if the source 305b of transistor 305 were coupled to ground (i.e., if third inductor 340 were not present). That is, the energy stored in third inductor 340 may be released into first inductor 315 driving the maximum amplitude of the AC signal at first inductor 315 above 2 Vdd. Stated alternatively, the source voltage Vs and the drain voltage Vd of transistor 305 swing substantially in phase. Therefore, when Vds (voltage across the source and drain) is at a maximum amplitude, which is from 2 Vdsat (2 times the drain voltage at full saturation of transistor 305) to 2 Vdd−2 Vdsat, the drain voltage Vd is pushed to a relatively high maximum voltage by the source voltage Vs. With the AC signal across first inductor 315 swinging above 2 Vdd, the power output from power amplifier 300 is relatively increased compared to traditional power amplifiers. For example, the power may be increased by as much as 2 dB compared to traditional power amplifiers.

Similarly, providing that the AC signals across the second and the fourth inductors 320 and 345 are in phase provides that the AC signal across second inductor 320 may have a higher maximum amplitude than if the source 310c of transistor 310 where coupled to Vdd (i.e., if the fourth inductor were not present). That is, the energy stored in fourth inductor 345 may be released into second inductor 320 driving the maximum amplitude of the AC signal at the second inductor above 2 Vdd. Stated alternatively, the source voltage Vs and the drain voltage Vd of transistor 310 swing substantially in phase. Therefore, when Vds is at a maximum amplitude, which is from 2 Vdsat to 2 Vdd−2 Vdsat, the drain voltage Vd is pushed to a relatively high maximum voltage by the source voltage Vs. With the AC signal across second inductor 320 swinging above 2 Vdd, the power output from power amplifier 300 is relatively increased compared to traditional power amplifiers. For example, the power may be increased by as much as 2 dB compared to traditional power amplifiers.

According to one embodiment, first phase conditioner 360 is configured to receive the AC signal from a first amplifier 360a (such as an op-amp). First phase conditioner 360 may include a first transformer inductor 360b and a second transformer inductor 360c. The first transformer inductor 360b may be inductively coupled to the first input inductor 350 forming a transformer therewith so as to condition the phase of the AC signal at gate 305a as described above. The second transformer inductor 360c may be inductively coupled to third inductor 340 forming a transformer therewith so as to condition the phase of the AC signal at the ground side of third inductor 340 as described above. First phase conditioner 360 may also include a first tank capacitor 360d in parallel (i.e., in a tank configuration) with first transformer inductor 360b. First phase conditioner 360 may also include a second tank capacitor 360e in a tank configuration with second transformer inductor 360c. According to one embodiment, first amplifier 360a is configured to receive an AC input, which may be the output from a previous stage power amplifier or the like. First amplifier 360a, first transformer inductor 360b, and second transformer inductor 360c may be disposed in series. More specifically, an output of first amplifier 360a may be coupled to a first end of first transformer inductor 360b, and a second end of first transformer inductor 360b may be coupled to a first end of second transformer inductor 360c. A second end of second transformer inductor 360c is coupled to ground.

According to another embodiment, second phase conditioner 365 is configured to receive the AC signal from a second amplifier 365a (such as an op-amp). Second phase conditioner 365 may include third transformer inductor 365b, and a fourth transformer inductor 365c. The third transformer inductor 365b may be inductively coupled to the second input inductor 355 forming a transformer therewith so as to condition the phase of the AC signal at gate 310a as described above. The fourth transformer inductor 365c may be inductively coupled to the fourth inductor 345 forming a transformer therewith so as to condition the phase of the AC signal at the voltage source Vdd side of fourth inductor 345 as described above. The second phase conditioner 365 may also include a third tank capacitor 365d in a tank configuration with third transformer inductor 365b. The second phase conditioner 365 may also include a fourth tank capacitor 365e in a tank configuration with fourth transformer inductor 365c. According to one embodiment, second amplifier 365a is configured to receive an AC input, which may be the output from the previous stage power amplifier or the like. The AC input received by the second amplifier 365a may be the same input received by the first amplifier 360a. Second amplifier 365a, third transformer inductor 365b, and fourth transformer inductor 365c may be disposed in series. More specifically, an output of second amplifier 365a may be coupled to a first end of third transformer inductor 365b, and a second end of third transformer inductor 365b may be coupled to a first end of fourth transformer inductor 365c. A second end of fourth transformer inductor 365c is coupled to ground or may be coupled to the voltage source Vdd.

While the first and second phase conditioners 360 and 365 are configured to provide that the various AC signals in power amplifier 300 are in phase or 180 degrees out of phase as described above, the higher order harmonics of the fundamental frequency of the AC signals in power amplifier 300 tend to push the AC signals in power amplifier 300 out of phase or push the AC signal from being 180 degrees out of phase and thus limit the maximum power output of power amplifier 300. The even harmonics (e.g., $2^{nd}$ harmonic, $4^{th}$ harmonic, etc.) of the AC signal that are at drain 305c of transistor 305 are generally 180 degrees out of phase with the even harmonics of the AC signal that are at drain 310b of transistor 310. Further, the even harmonics of the AC signal that are at source 305b of transistor 305 are generally 180 degrees out of phase with the even harmonics of the AC signal that are at source 310c of transistor 310.

The capacitance of capacitor 325a is determined such that the circuit path between the first output node 347a and the second output node 347b is substantially a short circuit for the even harmonics of the fundamental frequency of the AC signal, but is not a short circuit for the fundamental frequency of the AC signal. That is, capacitor 325a is configured to cancel 180 degree out of phase even harmonics of the fundamental frequency that are at opposite ends (i.e., different capacitive input nodes of capacitor 325a) of capacitor 325a. As the even harmonics on either side of capacitor 325a are out of 180 degrees phase and as capacitor 325a is substantially a short for the even harmonics on either side of capacitor 325a, the even harmonics on either side of capacitor 325a tend to cancel each other. Because the even harmonics on either side of capacitor 325a tend to cancel each other, capacitor 325a ensures that the even harmonics do not substantially pass into the inductors 315 and 320. As a result, unnecessary heating of the inductors 315 and 320 via the even harmonics is inhibited and stress across transistors 305 and 310 is also limited. Capacitor 325a may be replaced with alternative circuits that provide capacitance, such as a diode or the like according to one alternative embodiment. According to one embodiment, the first amplifier 360a and the second amplifier 365a are configured to deliver the same AC signal to AC inputs 350a and 355a. The first amplifier 360a and the second amplifier 365a may form portions of a previous stage amplifier. According to one specific embodiment, the first amplifier 350a and the second amplifier 355a may be the same amplifier circuit, which may be a previous stage amplifier.

The capacitance of capacitor 325b is determined such that the circuit path between source 305b of transistor 305 and source 310b of transistor 310 is substantially a short circuit for the even harmonics of the fundamental frequency of the AC signal, but is not a short circuit for the fundamental frequency of the AC signal. That is, capacitor 325a is configured to cancel 180 degree out of phase even harmonics of the fundamental frequency that are at opposite ends (i.e., different capacitive input nodes of capacitor 325a) of capacitor 325a. According to one specific embodiment, the capacitance of capacitor 325b is approximately 20 picofarads for an approximately 2 gigahertz AC signal. As the even harmonics on either side of capacitor 325b are out of 180 degrees phase and as capacitor 325b is substantially a short for the even harmonics on either side of capacitor 325b, the even harmonics on either side of capacitor 325b tend to cancel each other. Because the even harmonics on either side of capacitor 325b tend to cancel each other, capacitor 325b ensures that the even harmonics do not substantially pass into the third and the fourth inductors 340 and 345. As a result, unnecessary heating of the inductors 340 and 345 via the even harmonics is inhibited and stress across transistors 305 and 310 is also inhibited Capacitor 325b may be replaced with alternative circuits that provide capacitance, such as a diode or the like according to one alternative embodiment.

The voltage at the first output node 347a (i.e., the voltage at the drain of transistor 305) may be expressed as: $V_{dn} = \alpha_{0n} + \alpha_{1n}v(f_0) + \alpha_{2n}v(2f_0) + \alpha_{3n}v(3f_0) + \ldots$, and the voltage at the second output node 347b (i.e., the voltage at the drain of transistor 310) may be expressed as: $V_{dp} = \alpha_{0p} + \alpha_{1p}v(f_0) + =_{2p}v(2f_0) + \alpha_{3p}v(3f_0) + \ldots$. The even coefficients of the voltage expressions for nMOS transistors and pMOS transistors have different polarities (i.e., 180 degrees out of phase), providing for the substantial cancellation of the even harmonics across capacitor 325a.

According to one embodiment, the bodies of transistors 305 and 310 are linked by a capacitor 328. The capacitance of capacitor 328 is determined such that the circuit path between the bodies of transistors 305 and 310 is substantially a short circuit for the even harmonics of the fundamental frequency of the AC signal, but is not a short circuit for the fundamental frequency of the AC signal. Thereby, capacitor 328 ensures that the even harmonics on the bodies of transistors 305 and 310 is substantially reduced relative to the fundamental harmonic of the AC signal. The capacitance of capacitor 328 is determined such that the circuit path between the bodies of transistors 310 and 315 is substantially a short circuit for the even harmonics of the fundamental frequency of the AC signal, but is not a short circuit for the fundamental frequency of the AC signal. Thereby, capacitor 328 ensures that the even harmonics on the bodies of transistors 310 and 315 is substantially reduced relative to the fundamental harmonic of the AC signal. Substantial reduction and/or removal of the even harmonics of the AC signal on the bodies of transistors 305 and 310 ensures reduction in the stress on transistors 305 and 310 and thereby ensures improved power amplification by power amplifier 300.

Power amplifier 300 as shown in FIG. 3A is a single stage power amplifier that is not fully differential. Two power amplifiers 300 may be inductively coupled to form a fully-differential power amplifier according to one embodiment.

Figure 3B:
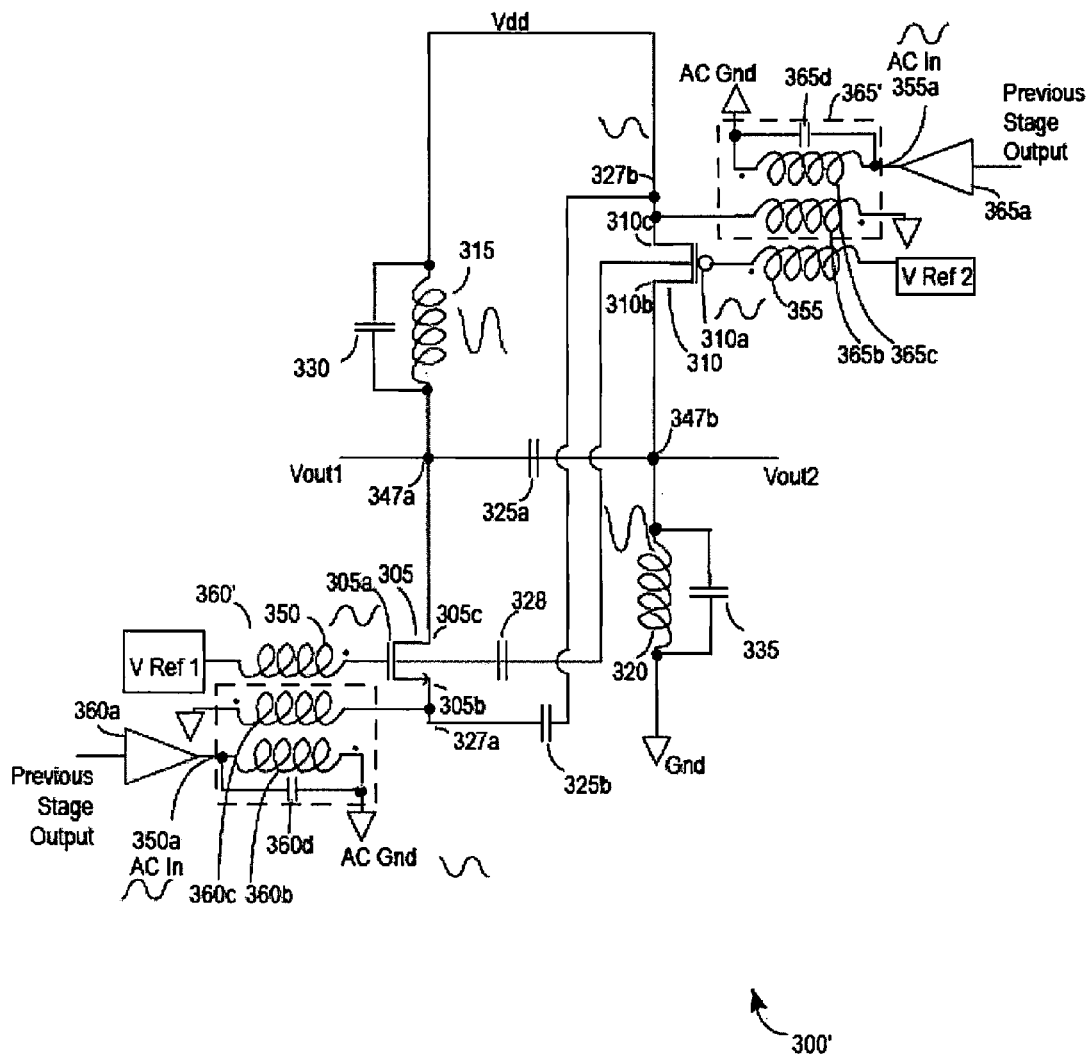
FIG. 3B is a simplified schematic of a power amplifier according to another embodiment.

FIG. 3B is a simplified schematic of a power amplifier 300' according to another embodiment. The same numbering scheme used above with respect to power amplifier 300 to identify elements of power amplifier 300' is used to identify the same elements or substantially similar elements of power amplifier 300'. Power amplifier 300' is substantially similar to power amplifier 300 but differs in that the phase conditioners 360' and 365' of power amplifier 300' are different from phase conditioners 360 and 365. Further, power amplifier 300' might not include third inductor 340 and fourth inductor 345. More specifically, power amplifier 300 is substantially similar to power amplifier 300 in that phase conditioner 360' is configured to set the phase the AC signal at the gate 305a of transistor 305 180 degree out of phase with the AC signal at source 305b of transistor 305, and phase conditioner 365' is configured to set the phase the AC signal at the gate 310a of transistor 310 180 degree out of phase with the AC signal at source 310c of transistor 310. Note that in power amplifier embodiment 300' source 305b of transistor may not be coupled to ground while the second end of inductor 320 is coupled to ground.

Phase conditioners 360' and 365' are described in further detail immediately below. Phase conditioner 360' includes the first transformer inductor 360b inductively coupled to the second transformer inductor 360c and inductively coupled to the first input inductor 350. Phase conditioner 360' further includes the second transformer inductor 360c inductively coupled to the first input inductor 350. First transformer inductor 360b includes a first end coupled to the output of the first amplifier 360a and includes a second end coupled to AC ground. Second transformer inductor 360c includes a first end coupled to AC ground and a second end coupled to the first mid-node 327a. First input inductor 350 includes a first end coupled to the first reference voltage (labeled V Ref 1 in FIG. 3B), which may be a DC bias voltage, and a second end coupled to the gate 305a of transistor 305.

The first transformer inductor 360b, the second transformer inductor 360c, and the first input inductor 350 are configured to set the phase of the AC signal received at input 350a 180 degrees out of phase with the AC signal at the first mid-node 327a. The first transformer inductor 360b, the second transformer inductor 360c, and the first input inductor 350 are further configured to set the phase of the AC signal received at input 350a in phase with the AC signal at the gate 305a of transistor 305 and 180 degrees out of phase with the AC signal at the first mid-node 327a.

Phase conditioner 365' includes the third transformer inductor 365b inductively coupled to the fourth transformer inductor 365c and inductively coupled to the second input inductor 355. Phase conditioner 365' further includes the fourth transformer inductor 365c inductively coupled to the second input inductor 355. Third transformer inductor 365b includes a first end coupled to the output of the second amplifier 365a and includes a second end coupled to AC ground. Fourth transformer inductor 365c includes a first end coupled to AC ground and a second end coupled to the second mid-node 327b. Second input inductor 355 includes a first end coupled to the second reference voltage (labeled V Ref 2 in FIG. 3B), which may be a DC bias voltage, and a second end coupled to the gate 310a of transistor 310. The first reference voltage V Ref 1 and the second reference voltage V Ref 2 may be the same voltage or a different voltage.

The third transformer inductor 365b, the fourth transformer inductor 365c, and the second input inductor 355 are configured to set the phase of the AC signal received at input 355a 180 degrees out of phase with the AC signal at the second mid-node 327b. The third transformer inductor 365b, the fourth transformer inductor 365c, and the second input inductor 355 are further configured to set the phase of the AC signal received at input 355a in phase with the AC signal at the gate 310a of transistor 310 and 180 degrees out of phase with the AC signal at the second mid-node 327b. Power amplifier 300' is configured to provide substantially the same power output increase as power amplifier 300 described above and provide substantially the same higher order harmonic cancellation.

Figure 4:
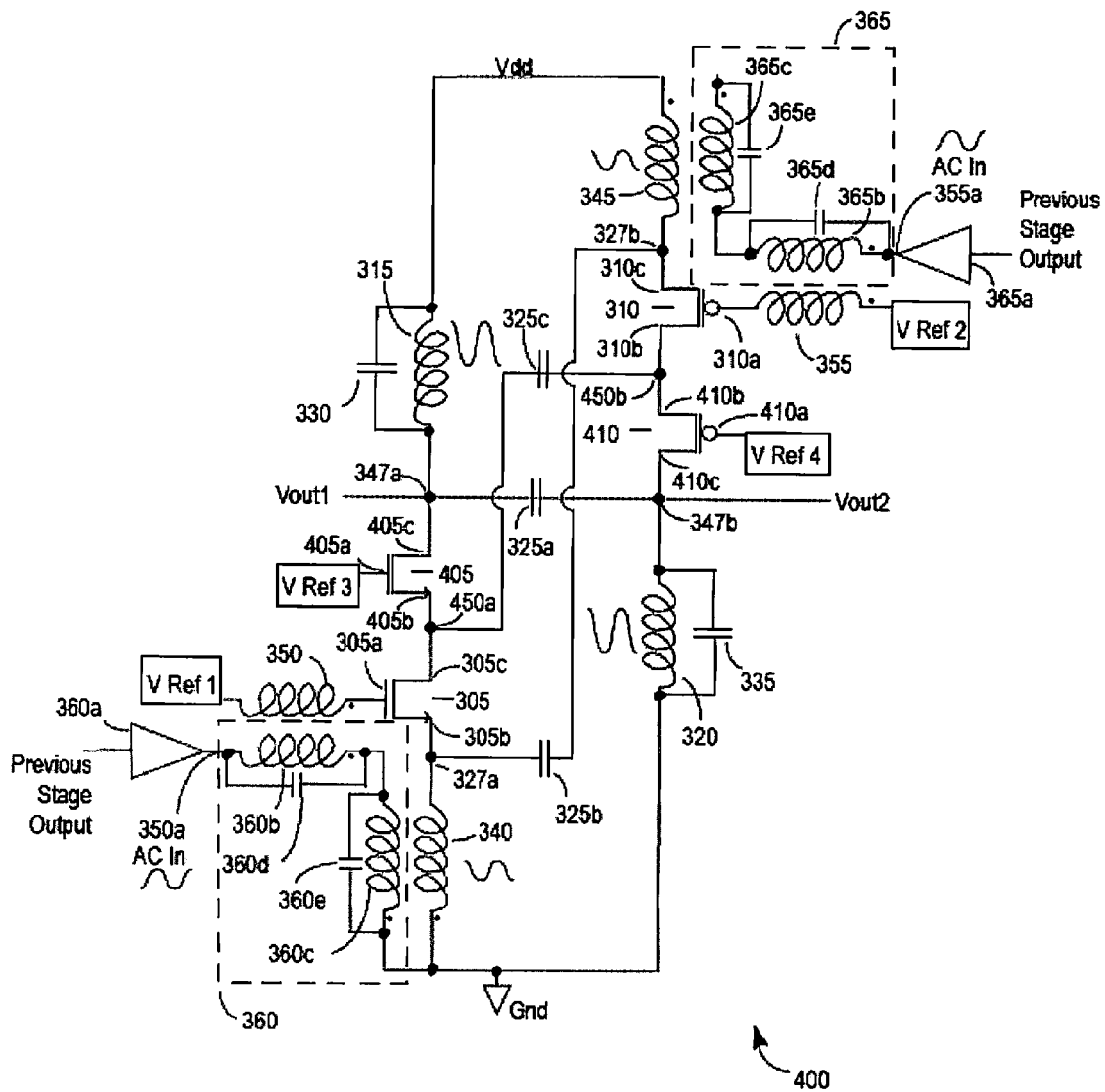
FIG. 4 is a simplified schematic of a power amplifier according to another embodiment.

FIG. 4 is a simplified schematic of a power amplifier 400 according to another embodiment. The same numbering schema used above is used to identify the same elements or substantially similar elements identified above. Power amplifier 400 is substantially similar to power amplifier 300 but differs in that power amplifier 400 includes a transistor 405 (e.g., an nMOS transistor) disposed between transistor 305 and the first inductor 315, and includes a transistor 410 (e.g., a pMOS transistor) disposed between transistor 310 and second inductor 320. Transistors 305 and 405 may be in a cascode configuration with a, respective, common source, common ground configuration. Transistors 405 and 410 are sometimes referred to herein as a second push-pull pair of transistors. More specifically a source 405b of transistor 405 may be coupled to the drain 305c of transistor 305, and a drain 405c of transistor 405 may be coupled to the first end of first inductor 315 where the second end of first inductor 315 is coupled to the voltage source Vdd. A gate 405a of transistor 405 may be coupled to a third reference voltage (labeled V Ref 3 in FIG. 4) to relatively strongly turn on transistor 405.

Transistors 310 and 410 may similarly be in a cascode configuration with a, respective, common source, common ground configuration. More specifically a source 410b of transistor 410 may be coupled to the drain 310b of transistor 310, and a drain 410c of transistor 410 may be coupled to the first end of second inductor 320 where the second end of inductor 320 is coupled to ground. A gate 410a of transistor 410 may be coupled to a fourth reference voltage (labeled V Ref 4 in FIG. 4) to relatively strongly turn on transistor 410. The cascode configuration of the transistors provide for stress protection of power amplifier 400 as will be well understood by those of skill in the art. Power amplifier 400 is substantially similar to power amplifier 300 in that the third inductor 340 is configured to raise the maximum voltage of the of the AC signal across the first inductor 315, and the fourth inductor 345 is configured to raise the maximum voltage of the AC signal across the second inductor 320. As described above, raising the maximum voltages across first inductor 315 and second inductor 320 increases the power output from voltage outputs Vout1 and Vout2 of a power amplified AC signal amplified by power amplifier 400.

Power amplifier 400 may also include a capacitor 325c having a first capacitor node coupled to both the drain 305c of transistor 305 and the source 405b of transistor 405 (a first mid-node 450a between transistor 305 and transistor 405), and a second capacitor node coupled to both the drain 310b of transistor 310 and the source 410b of transistor 410 (a second mid-node 450b between transistor 310 and transistor 410). Similar to capacitors 325a and 325b described above, the capacitance of capacitor 325c is determined such that the circuit path between first mid-node 450a and second mid-node 450b is substantially a short circuit for the even harmonics of the fundamental frequency of the AC signal, but is not a short circuit for the fundamental frequency of the AC signal. That is, capacitor 325c is configured to cancel 180 degree out of phase even harmonics of the fundamental frequency that are at opposite ends (i.e., different capacitive input nodes of capacitor 325c) of capacitor 325c. According to one specific embodiment, the capacitance of capacitor 325c is approximately 20 picofarads for an approximately 2 gigahertz AC signal. As the even harmonics on either side of capacitor 325c are out of 180 degrees phase and as capacitor 325c is substantially a short for the even harmonics on either side of capacitor 325c, the even harmonics on either side of capacitor 325c tend to cancel each other. Because the even harmonics on either side of capacitor 325c tend to cancel each other, capacitor 325c stress across transistors 305, 310, 405, and 410 is also limited.

More specifically, capacitors 325a, 325b, and 325c are configured to substantially reduce the even harmonics at the sources and drains of transistors 305, 310, 405, and 410. That is, the amplitude of the fundamental frequency of the AC signal is substantially larger than the even harmonics at the sources and drains of transistors 305, 310, 405, and 410. As a result, the difference in the voltages across transistors 305 and 405 is reduced, and the difference in the voltages across transistors 310 and 410 is reduced. That is, the voltages across transistors 305 and 405, at any instant, are substantially the same, and the voltages across transistors 310 and 410, at any instant, are substantially the same. That is, the voltage across one of transistor 305 or transistor 405 will not be substantially greater than the voltage across of the other of transistor 305 and 405. Further, the voltage across one of transistor 310 or transistor 410 will not be substantially greater than the voltage across of the other of transistor 310 and 410.

With the voltage across one of transistor 305 or transistor 405 greater than the voltage across the other of transistor 305 and 405, the transistor (e.g., transistor 305) having the largest voltage across this transistor (e.g., transistor 305) limits how high the voltage can swing across this transistor (e.g., transistor 305) and thereby limits the maximum voltage swing of both transistors 305 and 405 and limits the power output of amplifier 400.

Similarly, with the voltage across one of transistor 310 or transistor 410 greater than the voltage across the other of transistor 310 and 410, the transistor (e.g., transistor 310) having the largest voltage across this transistor (e.g., transistor 310) limits how high the voltage can swing across this transistor (e.g., transistor 310) and thereby limits the maximum voltage swing of both transistors 310 and 410 and limits the power output of amplifier 400.

Because capacitors 325a, 325b, and 325c equalize the voltages across transistors 305 and 405, and equalize the voltages across transistors 310 and 410, transistors 305 and 405 may both swing to a relatively higher voltage than if the voltage across one of transistors 305 or 405 were higher than the voltage across the other of transistor 305 or 405. Similarly, transistors 310 and 410 may both swing to a relatively higher voltage than if the voltage across one of transistors 310 or 410 were higher than the voltage across the other of transistor 310 or 410. Because amplifier 400 ensures that the voltages across the transistors 305 and 405 may both swing relatively high, and the voltages across transistors 310 and 410 may both swing relatively high, the power output of amplifier 400 is improved. According to one alternative embodiment, power amplifier 400 may be similarly configured to power amplifier 300' in that power amplifier 400 may include phase conditioners 360' and 365' and might not include inductors 340 and 345.

Figure 5:
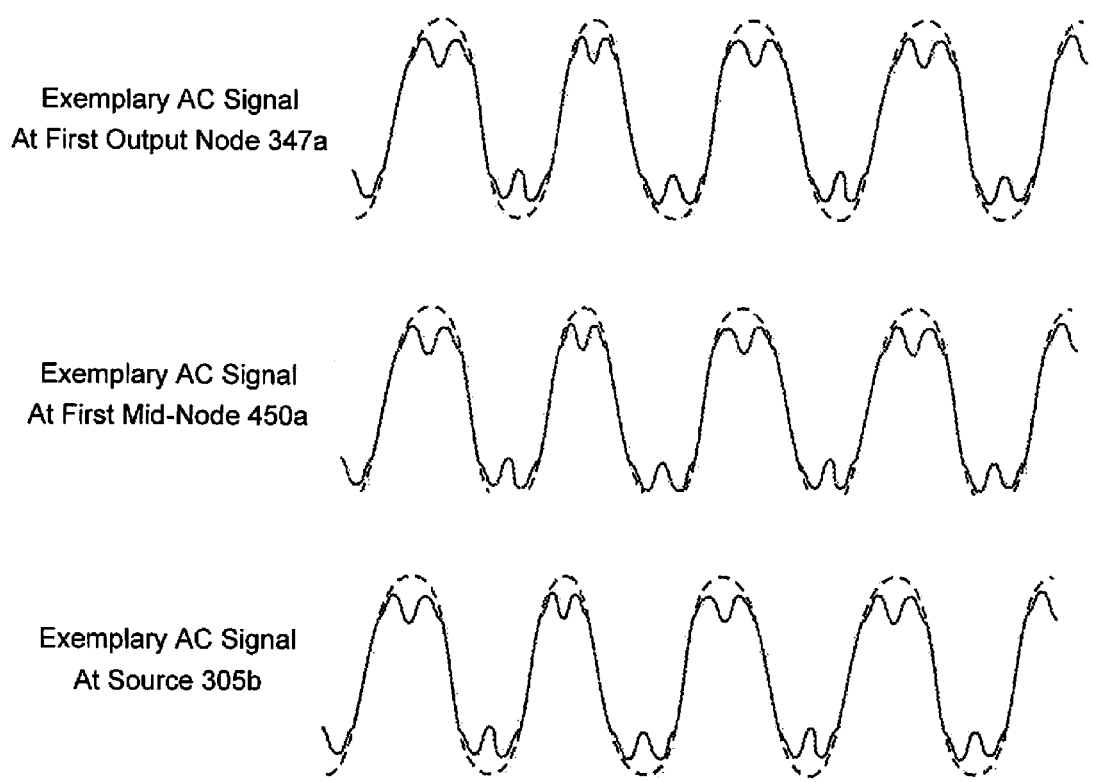
FIG. 5 is a simplified schematic of three example AC signals that may be at the first output node, the first mid-node, and a source node.

FIG. 5 is a simplified schematic of three example AC signals that may be at the first output node 347a, the first mid-node 450a, and source 305b, without capacitors 325a, 325b, and 325c included in amplifier 400 place and with capacitors 325a, 325b, and 325c included in amplifier 400. The uneven shapes (solid wiggles lines at the tops and bottoms the AC signals) of the AC signals show example even harmonics imposed on the AC signals. The relatively smooth shapes (dashed lines at the tops and bottoms of the AC signals) of the AC signals show the even harmonics substantially removed from the fundamental frequency by capacitors 325a, 325b, and 325c. The even harmonics of the AC signals may be different and the difference between the even harmonics between any two nodes (e.g., first output node 347a and first mid-node 450a) in a power amplifier without capacitors 325a, 325b, and 325c represent the voltage difference that can arise between the nodes and cause stress in the transistors in a power amplifier. Embodiments of power amplifier 400 ensure that the even harmonics as shown in FIG. 5 are removed from the AC signals in amplifier 400 to reduce stress as described herein.

Figure 6:
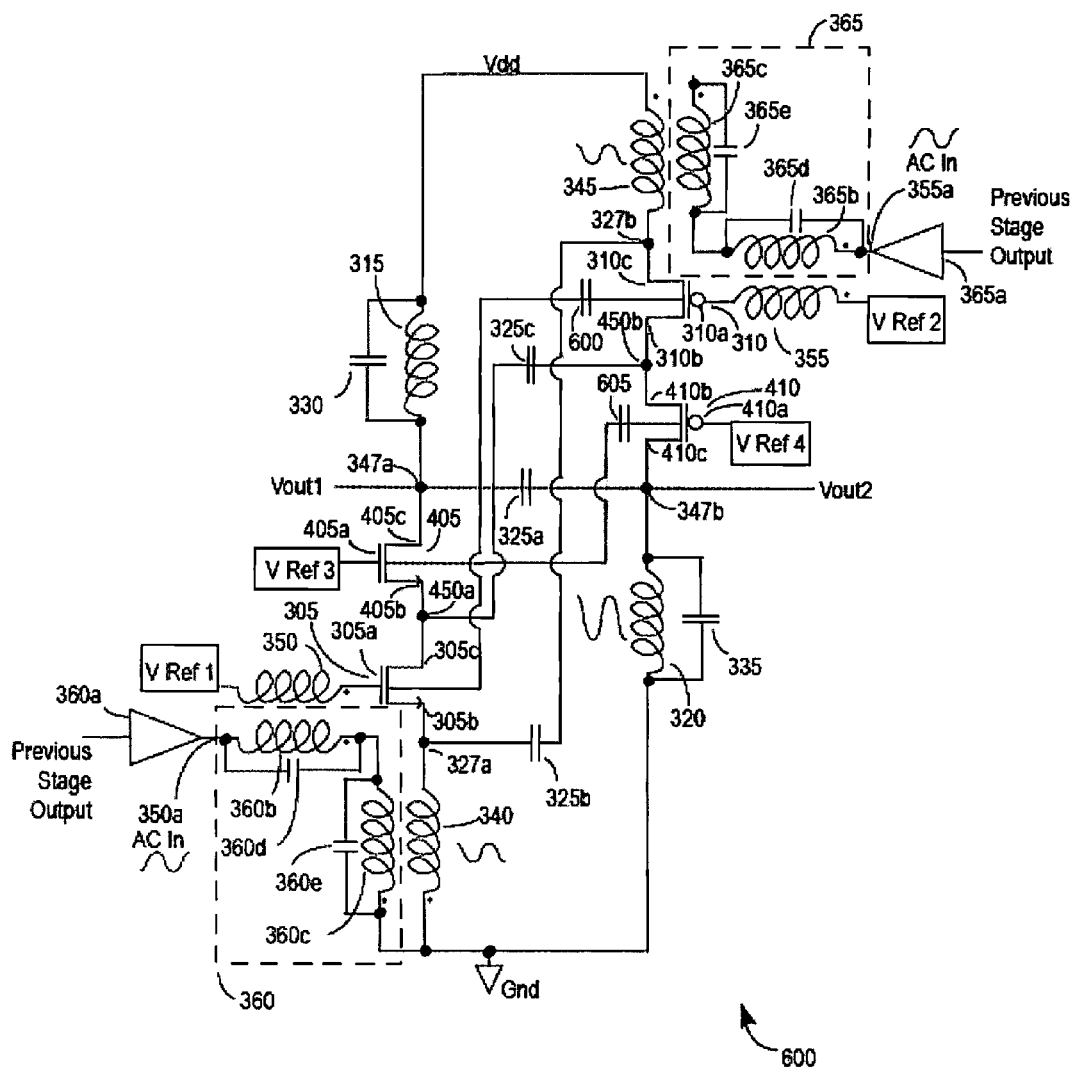
FIG. 6 is a simplified schematic of a power amplifier according to another embodiment.

FIG. 6 is a simplified schematic of a power amplifier 600 according to another embodiment. Power amplifier 600 is substantially similar to power amplifier 400 but differs in that the bodies of transistors 305 and 310 are linked by a capacitor 605, and the bodies of transistors 405 and 410 are linked by a capacitor 610. The capacitance of capacitor 605 is determined such that the circuit path between the bodies of transistors 305 and 310 is substantially a short circuit for the even harmonics of the fundamental frequency of the AC signal, but is not a short circuit for the fundamental frequency of the AC signal. Thereby, capacitor 605 ensures that the even harmonics on the bodies of transistors 305 and 310 is substantially reduced relative to the fundamental harmonic of the AC signal. The capacitance of capacitor 610 is determined such that the circuit path between the bodies of transistors 310 and 315 is substantially a short circuit for the even harmonics of the fundamental frequency of the AC signal, but is not a short circuit for the fundamental frequency of the AC signal. Thereby, capacitor 610 ensures that the even harmonics on the bodies of transistors 310 and 315 is substantially reduced relative to the fundamental harmonic of the AC signal. Substantial reduction and/or removal of the even harmonics of the AC signal on the bodies of transistors 305, 310, 405, and 410 ensures reduction in the stress on transistors 305, 310, 405, and 410 and thereby ensures improved power amplification by power amplifier 600. According to one alternative embodiment, power amplifier 600 may be similarly configured to power amplifier 300' in that power amplifier 600 may include phase conditioners 360' and 365' and might not include inductors 340 and 345. Each of the power amplifiers described herein may be included in a fully-differential power applier according to various embodiments where each fully-differential power amplifier includes two power amplifiers as will be well understood by those of skill in the art.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A power amplifier comprising:
a first transistor;
a first inductor disposed between the first transistor and a voltage source, wherein a first node between the first transistor and the first inductor is a first output node;
a second inductor disposed between the first transistor and ground;
a second transistor;
a third inductor disposed between the second transistor and ground, wherein a second node between the second transistor and the third inductor is a second output node;
a fourth inductor disposed between the second transistor and the voltage source;
a first capacitor disposed between the first output node and the second output node, wherein the first capacitor is configured as a pathway for cancellation of even harmonic signals on opposite ends of the first capacitor, wherein the even harmonic signals are harmonics of a fundamental frequency of a received AC signal;
a second capacitor disposed between (i) a first mid-node that is between the first transistor and the second inductor, and (ii) a second mid-node that is between the second transistor and the fourth inductor, wherein the second capacitor is configured as a pathway for cancellation of the even harmonic signals on opposite ends of the second capacitor; and
a third capacitor disposed between a body of the first transistor and a body of the second transistor, wherein the third capacitor is configured as a pathway for cancellation of even harmonic signals on opposite ends of the third capacitor.

2. A power amplifier comprising:
a first transistor;
a first inductor disposed between the first transistor and a voltage source, wherein a first node between the first transistor and the first inductor is a first output node;
a second inductor disposed between the first transistor and ground;

a second transistor;
a third inductor disposed between the second transistor and ground, wherein a second node between the second transistor and the third inductor is a second output node;
a fourth inductor disposed between the second transistor and the voltage source;
a first capacitor disposed between the first output node and the second output node, wherein the first capacitor is configured as a pathway for cancellation of even harmonic signals on opposite ends of the first capacitor, wherein the even harmonic signals are harmonics of a fundamental frequency of a received AC signal;
a second capacitor disposed between (i) a first mid-node that is between the first transistor and the second inductor, and (ii) a second mid-node that is between the second transistor and the fourth inductor, wherein the second capacitor is configured as a pathway for cancellation of the even harmonic signals on opposite ends of the second capacitor;
a third transistor disposed between the first transistor and the first inductor; and
a fourth transistor disposed between the second transistor and the third inductor.

3. The power amplifier of claim 2, wherein the first and the third transistors are in a first cascode configuration, and the second and the fourth transistors are in a second cascode configuration.

4. The power amplifier of claim 2, further comprising a third capacitor disposed between (i) third mid-node that is between the first and the third transistors, and (ii) a fourth mid-node that is between the second and the fourth transistors, wherein the third capacitor is configured as a pathway for cancellation of the even harmonic signals on opposite ends of the third capacitor.

5. The power amplifier of claim 4, wherein the first, the second, and the third capacitors are configured to equalize voltage differences across the first, the second, the third, and the fourth transistors.

6. The power amplifier of claim 2, wherein the first and the third transistors are nMOS transistors, and the second and the fourth transistors are pMOS transistors.

7. The power amplifier of claim 2, further comprising a third capacitor disposed between a body of the third transistor and a body of the fourth transistor, wherein the third capacitor is configured as a pathway for cancellation of even harmonic signals on opposite ends of the third capacitor.

8. A power amplifier comprising:
a first transistor;
a first inductor disposed between the first transistor and a voltage source, wherein a first node between the first transistor and the first inductor is a first output node;
a second inductor disposed between the first transistor and ground;
a second transistor;
a third inductor disposed between the second transistor and ground, wherein a second node between the second transistor and the third inductor is a second output node;
a fourth inductor disposed between the second transistor and the voltage source;
a first capacitor disposed between the first output node and the second output node, wherein the first capacitor is configured as a pathway for cancellation of even harmonic signals on opposite ends of the first capacitor, wherein the even harmonic signals are harmonics of a fundamental frequency of a received AC signal;
a second capacitor disposed between (i) a first mid-node that is between the first transistor and the second inductor, and (ii) a second mid-node that is between the second transistor and the fourth inductor, wherein the second capacitor is configured as a pathway for cancellation of the even harmonic signals on opposite ends of the second capacitor;
a third capacitor in parallel with the first inductor; and
a fourth capacitor in parallel with the fourth inductor.

9. A fully-differential power amplifier comprising:
a first amplifier stage including:
  a first transistor;
  a first inductor disposed between the first transistor and a voltage source, wherein a first node between the first transistor and the first inductor is a first output node;
  a second inductor disposed between the first transistor and ground;
  a second transistor;
  a third inductor disposed between the second transistor and ground, wherein a second node between the second transistor and the third inductor is a second output node;
  a fourth inductor disposed between the second transistor and the voltage source;
  a first capacitor disposed between the first output node and the second output node, wherein the first capacitor is configured as a pathway for cancellation of even harmonic signals on opposite ends of the first capacitor, wherein the even harmonic signals are harmonics of a fundamental frequency of a received AC signal; and
  a second capacitor disposed between (i) first mid-node that is between the first transistor and the second inductor, and (ii) a second mid-node that is between the second transistor and the fourth inductor, wherein the second capacitor is configured as a pathway for cancellation of the even harmonic signals on opposite ends of the second capacitor; and
a second amplifier stage including:
  a third transistor;
  a fifth inductor disposed between the third transistor and the voltage source, wherein a third node between the third transistor and the fifth inductor is a third output node;
  a sixth inductor disposed between the third transistor and ground;
  a fourth transistor;
  a seventh inductor disposed between the third transistor and ground, wherein a fourth node between the fourth transistor and the seventh inductor is a fourth output node;
  an eighth inductor disposed between the fourth transistor and the voltage source;
  a third capacitor disposed between the third output node and the fourth output node, wherein the third capacitor is configured as a pathway for cancellation of the even harmonic signals on opposite ends of the third capacitor; and
  a fourth capacitor disposed between (i) third mid-node that is between the third transistor and the fifth inductor, and (ii) a fourth mid-node that is between the fourth transistor and eighth inductor, wherein the fourth capacitor is configured as a pathway for cancellation of the even harmonic signals on opposite ends of the fourth capacitor; and
  a fifth capacitor disposed between gates of the first and the fourth transistors, wherein the fifth capacitor is configured as a pathway for cancellation of the even harmonic signals on opposite ends of the fifth capacitor.

10. The fully-differential power amplifier of claim 9, further comprising a sixth capacitor disposed between gates of the second and the third transistors, wherein the sixth capacitor is configured as a pathway for cancellation of the even harmonic signals on opposite ends of the sixth capacitor.

11. The fully-differential power amplifier of claim 9, further comprising a sixth capacitor disposed between a body of the first transistor and a body of the second transistor, wherein the sixth capacitor is configured as a pathway for cancellation of even harmonic signals on opposite ends of the sixth capacitor.

12. The fully-differential power amplifier of claim 11, further comprising a seventh capacitor disposed between a body of the third transistor and a body of the fourth transistor, wherein the seventh capacitor is configured as a pathway for cancellation of even harmonic signals on opposite ends of the seventh capacitor.

13. The fully-differential power amplifier of claim 9, wherein the first amplifier stage further includes (i) fifth transistor disposed between the first transistor and the first inductor, and (ii) a sixth transistor disposed between the second transistor and the fourth inductor.

14. The fully-differential power amplifier of claim 13, further comprising a sixth capacitor disposed between a body of the fifth transistor and a body of the sixth transistor, wherein the sixth capacitor is configured as a pathway for cancellation of even harmonic signals on opposite ends of the sixth capacitor.

15. The fully-differential power amplifier of claim 13, wherein the second amplifier stage further includes (i) seventh transistor disposed between the third transistor and the fifth inductor, and (ii) an eighth transistor disposed between the fourth transistor and the eighth inductor.

16. The fully-differential power amplifier of claim 15, further comprising a seventh capacitor disposed between a body of the seventh transistor and a body of the eighth transistor, wherein the seventh capacitor is configured as a pathway for cancellation of even harmonic signals on opposite ends of the seventh capacitor.

17. The fully-differential power amplifier of claim 15, further comprising a sixth capacitor disposed between (i) gates of the first transistor and the fourth transistor, and (ii) gates of the sixth transistor and the seventh transistor, wherein the sixth capacitor is configured as a pathway for cancellation of even harmonic signals on opposite ends of the sixth capacitor.

18. The fully-differential power amplifier of claim 17, further comprising a seventh capacitor disposed between (i) gates of the second transistor and the third transistor, and (ii) gates of the fourth transistor and the fifth transistor, wherein the seventh capacitor is configured as a pathway for cancellation of even harmonic signals on opposite ends of the seventh capacitor.

19. A power-amplifier operation method for a power amplifier, the power-amplifier operation method comprising:
receiving an AC signal at an input;
canceling even harmonics of the AC signal across a first output node and a second output node via a capacitor;
transmitting the AC signal between the first output node and the second output node via the capacitor;
outputting at the first output node and the second output node an amplified AC signal, which is an amplification of the AC signal; and
canceling the even harmonics of the AC signal across a first mid-node and a second mid-node via a second capacitor, wherein:
the first mid-node is between first and second transistors in a first cascode,
the second mid-node is between third and fourth transistors in a second cascode, and
the first cascode and the second cascode are parallel between a voltage source and ground.

20. The power-amplifier operation method of claim 19, further comprising canceling the even harmonics of the AC signal across a third mid-node and a fourth mid-node via a third capacitor, wherein:
the third mid-node is between the first transistor and a first inductor, wherein the first inductor is coupled to ground, and
the fourth mid-node is between the third transistor and a second inductor, wherein the second inductor is coupled to the voltage source.

21. The power-amplifier operation method of claim 19, further comprising:
canceling the even harmonics of the AC signal across bodies of the first and the third transistors via a third capacitor; and
canceling the even harmonics of the AC signal across bodies of the second and the fourth transistors via a fourth capacitor.

* * * * *